(12) United States Patent
Tazarine et al.

(10) Patent No.: US 9,860,986 B2
(45) Date of Patent: Jan. 2, 2018

(54) CIRCUIT ARRANGEMENT FOR VEHICLES AND USE OF A CIRCUIT ARRANGEMENT

(71) Applicant: Auto-Kabel Management GmbH, Hausen i.W. (DE)

(72) Inventors: Wacim Tazarine, Mönchengladbach (DE); Simon Betscher, Grevenbroich (DE); Frank Gronwald, Bedburg (DE); Sohejl Rafati, Mönchengladbach (DE)

(73) Assignee: Auto-Kabel Management GmbH, Hausen i.W. (DE)

( * ) Notice: Subject to any disclaimer, the term of this patent is extended or adjusted under 35 U.S.C. 154(b) by 0 days.

(21) Appl. No.: 15/310,530

(22) PCT Filed: Mar. 5, 2015

(86) PCT No.: PCT/EP2015/054582
§ 371 (c)(1),
(2) Date: Nov. 11, 2016

(87) PCT Pub. No.: WO2015/172904
PCT Pub. Date: Nov. 19, 2015

(65) Prior Publication Data
US 2017/0094790 A1    Mar. 30, 2017

(30) Foreign Application Priority Data
May 13, 2014   (DE) .................. 10 2014 006 841

(51) Int. Cl.
*H05K 1/14*   (2006.01)
*H05K 1/02*   (2006.01)
(Continued)

(52) U.S. Cl.
CPC ............. *H05K 1/14* (2013.01); *F02N 11/087* (2013.01); *F02N 11/0862* (2013.01);
(Continued)

(58) Field of Classification Search
None
See application file for complete search history.

(56) References Cited

U.S. PATENT DOCUMENTS 6,215,681 B1 * 4/2001 Schuurman ........... H02M 7/003
                                                     174/70 C
9,422,910 B2    8/2016 Gronwald ............. F02N 11/087
(Continued)

FOREIGN PATENT DOCUMENTS

DE   20 2005 019 094 U1   5/2006   ............... H05K 7/20
DE   10 2006 059 702 A1   4/2008   ............. H01L 33/00
(Continued)

OTHER PUBLICATIONS

"A Beginner's Guide to the MOSFET", Reibot.org, https://reibot.org/2011/09/06/a-beginners-guide-to-the-mosfet/, 10 pages, Sep. 6, 2011.
(Continued)

*Primary Examiner* — Dimary Lopez Cruz
*Assistant Examiner* — Zhengfu Feng
(74) *Attorney, Agent, or Firm* — Sunstein Kann Murphy & Timbers LLP (57) ABSTRACT

Circuit arrangement for vehicles with at least one semiconductor element 30 and at least one first metal carrier plate 2a and a metal circuit board 2b. A multifaceted scope of application is provided if the carrier plate 2a is electrically insulated from the circuit board 2b and the carrier plate 2a is electrically linked with at least one of the circuit boards 2b by means of at least one semiconductor device 30 so that the carrier plate 2a and the circuit board 2b form an electrical three-pole.

21 Claims, 6 Drawing Sheets

(51) Int. Cl.
*H05K 1/11* (2006.01)
*H05K 1/09* (2006.01)
*F02N 11/08* (2006.01)

(52) U.S. Cl.
CPC ......... *H05K 1/0204* (2013.01); *H05K 1/0263* (2013.01); *H05K 1/09* (2013.01); *H05K 1/111* (2013.01); *F02N 2011/0874* (2013.01); *H05K 2201/04* (2013.01); *H05K 2201/06* (2013.01); *H05K 2201/07* (2013.01); *H05K 2201/10166* (2013.01); *H05K 2201/10174* (2013.01)

(56) References Cited

U.S. PATENT DOCUMENTS

| | | | |
|---|---|---|---|
| 2010/0073976 A1 | 3/2010 | Kimura et al. | 363/95 |
| 2010/0237816 A1 | 9/2010 | Seki et al. | 318/400.29 |

FOREIGN PATENT DOCUMENTS

| | | | | |
|---|---|---|---|---|
| DE | 10 2011 014 023 A1 | 9/2012 | | B60R 16/03 |
| EP | 1 100 294 A2 | 5/2001 | | H05K 1/02 |
| JP | 5-327152 | 12/1993 | | H05K 1/05 |
| WO | WO 2011/032966 A1 | 3/2011 | | H01L 23/495 |

OTHER PUBLICATIONS

International Searching Authority, International Search Report—International Application No. PCT/EP2015/054582, dated Jun. 19, 2015, together with the Written Report of the International Searching Authority, 11 pages (in German).

International Preliminary Examining Authority, International Preliminary Report on Patentability—International Application No. PCT/EP2015/054582, dated Sep. 5, 2016, 19 pages (in German).

\* cited by examiner

CIRCUIT ARRANGEMENT FOR VEHICLES AND USE OF A CIRCUIT ARRANGEMENT

The subject-matter relates to a circuit arrangement for vehicles as well as the use of a circuit arrangement for vehicles in various applications.

Increasing cost pressure in the field of vehicle technology leads to the situation that electronic components must be suitable for various operational purposes. Individualised circuit arrangements are the current practice particularly in power electronics, for example, in battery management, in start-stop technology as well as in charging management, e.g. with recuperation. These individualised circuit arrangements, which are arranged in the available space and adjusted in area of the battery cable, are complex to develop and therefore are expensive. In addition, the unit volumes cannot be scaled because a suitable circuit arrangement must be developed for each application.

These disadvantages lead to the objective task of providing a circuit arrangement for power electronics in vehicles; said circuit arrangement is modular in such a way that it may be used for various purposes, depending on the placement.

This task is objectively solved by means of a circuit arrangement according to claim 1.

The circuit arrangement according to the subject matter has at least one semiconductor device. For example, transistors can be used here, such as FETs, MOSFETs, IGBTs, thyristors or the like. The circuit arrangement is fitted according to the subject matter with at least one semiconductor device, whereby the assembly preferably takes place by means of SMD (surface mounted device) technology.

For a multifaceted applicability, it is necessary that the circuit arrangement be constructed in such a way that the assembly and subsequent circuitry can take place in the widest range of applications on the same layout. This means that the geometry as well as the layout of the circuit arrangement is preferably structured in the same way for many different applications.

Especially the layout, primarily of the circuit boards, is realised in such a way that it can be used in the widest range of applications while having the same layout. This has the advantage that the circuit arrangement according to the subject matter may be produced in high unit volumes and the assembly with semiconductor devices can take place according to the respective purpose. By means of an appropriate driving of the semiconductor device, the circuit arrangements can be used in various applications in the field of automotive engineering. A consistent layout can thereby be achieved in that a first metal carrier plate and two metal printed circuit boards are provided.

The carrier plate as well as the circuit board serve as mechanical carriers for the semiconductor device(s) and conduct heat very well since they are made from metal. This ensures that in the field of power electronics the heat flow from the semiconductor device is sufficient. Thus, increased conductivity of the circuit arrangement, for example for currents of 50 ampere, 100 ampere and more, may be realised.

In particular, the use as a rectifier in an electric vehicle or a hybrid vehicle is preferred. Preferably, a use in applications is recommended which work with currents of more than 10 A, preferably more than 50 A or more than 300 A.

The carrier plate is spaced electrically insulated from the circuit board. A gap, for example, an air gap between the carrier plate and the circuit board can be formed here. This gap can also be filled with insulation material.

By means of assembly, the carrier plate is electrically connected with at least one of the circuit boards by means of at least one semiconductor device. Preferably, at least two semiconductor devices are provided and the carrier plate is electrically connected with each one of the circuit boards by means of at least one semiconductor device. The electrical current path from the carrier plate to the circuit board is provided by at least one semiconductor device respectively. Depending on the type of semiconductor device and/or gate driver of the semiconductor device, different circuitry may be realised between the circuit board and the carrier plate, said circuitry being appropriate for the particular intended use.

It has turned out that the modularity is particularity high if the semiconductor device connects the carrier plate with the circuit board in such a way that the carrier plate and the circuit board form an electrical three-pole. During operation, by means of an appropriate driving of the semiconductor device, the circuit arrangement is to be operated in such a way that the carrier plate and the circuit board each can have a different electrical potential. However, it is also possible for the circuit boards to be short-circuited and thus to create a two-way terminal from the three-pole. However, this is dependent on the particular application. Yet the layout always enables the realisation of a three-pole with a driving the semiconductors, in particular, gate/basic control connections. This driving is realised by means of conductive tracks on the circuit board and the layout is preferably identical for all applications.

The three-pole according to the subject-matter can be used in various circuitry. For example, it is proposed that the electrical three-pole be used in or for an electronic battery safety terminal. Such an electronic battery safety terminal makes it possible to disconnect the battery, particularly the B+ terminal, from the on-board power supply. In the event of a crash, it is necessary to disconnect the battery from the power supply, particularly from the starter cable. For this purpose, it must be possible to switch the battery cable, and if necessary, under current, very quickly by means of appropriate power electronics. According to the subject-matter the circuit arrangement can be connected with the carrier plate to the battery terminal. At least one of the circuit boards is electrically connected with the battery cable, particularly the starter cable. In the event of a crash, the semiconductor device between the carrier plate and the circuit board can be controlled in such a way that it disconnects the electrical connection between the carrier plate and the circuit board.

An increased ampacity of the battery safety terminals may thus be realised in that both circuit boards are short-circuited on the output side. Therefore, there are two current paths from the carrier plate to the circuit boards respectively. The battery current flows by means of both of these current paths during operation. In the event of a crash, both current paths can independently or jointly be switched off.

It is also possible that one of the circuit boards is connected with a battery cable which is critical to safety and the other circuit board is electrically connected with the part of the on-board power supply which is not relevant to safety. In the event of a crash, the electrical connection between the carrier plate and the first of the two circuit boards can be disconnected so that a switching off that is critical to safety takes place, for example. The rest of the on-board power supply can remain connected to the battery.

It is also possible for the circuit arrangement to be used in a starting current limit. The starting current limit is primarily used in the field of start-stop technology. During the start-up, a drop in the on-board power supply must be prevented. This is usually the case whenever the starter is started to rotate. In this moment, the ignition coil nearly causes a short-circuit of the battery terminals and the battery voltage can drop. However, the situation must be prevented in that the starter current becomes so great that the battery voltage drops below a critical value. Therefore, during the start-up moment the resistance of the starter cable must be increased, which leads to a current limitation. The three-pole can be connected, for example, with the carrier plate and thus with the battery terminal. At least one of the circuit boards can be connected with the battery cable. There is an electrical resistance arranged between the carrier plate and the circuit board which, if applicable, is also formed from a semiconductor. In addition to the resistance, an electrical switch can be formed by means of a semiconductor device. During the start-up moment, the switch is open and the starting current flows by means of the resistance and is limited by it. A short time after the start-up, the switch can be closed and the starting current then flows by means of the switch as well as the resistance.

A starting current limit with an almost twice as great ampacity can thereby be realised in that both circuit boards are connected with the battery cable on the output side. The carrier plate can be connected with the battery terminal. At least one switch is connected between the carrier plate and each of the circuit boards by means of a semiconductor device and an electrical resistance. Both switches are open during start-up and current flows from the carrier plate to the circuit board by means of both resistances. After the start-up, the switches can be closed at the same time or one right after the other and the starting current then flows from the carrier plate to the battery cable by means of one or both switches and circuit boards.

Also to be used in start-stop technology, the circuit arrangement can be used as an on-board power supply stabiliser. Here, a starter battery as well as an on-board power supply battery can be provided, for example. The circuit arrangement can be used as a Q-diode between both positive battery terminals. The carrier plate is connected with the positive terminal of an on-board power supply and at least one of the circuit boards is connected with the positive terminal of the starter battery. During the start-up, the semiconductor device, which is arranged as a switch between the carrier plate and the circuit board, can be open and the starter current flows exclusively from the starter battery to the starter. Then the on-board power supply battery is not loaded by the starter and it holds its voltage. The switch can be closed immediately after the start-up.

The switch can also function as a Q-diode. This results in the compensating current only being able to flow between the on-board power supply battery and the starter battery in one direction.

In particular, the circuit arrangement can be operated in such a way that it is not required for all three terminals of the three-pole to be connected. A terminal can also be switched and various functions can be realised by means of appropriate placement and control.

This is also the case if a battery overcharging is used protection, for example. This is required, for example, for lithium-ion batteries. The circuit arrangement can be connected between the battery terminal and the outputs of the battery cells. A circuit board is connected with the output of the battery cells and a circuit board is connected with the battery terminal. The carrier plate is connected with one of the circuit boards by means of a semiconductor device and one of the circuit board by means of a connected antiparallel diode. Depending on the switch setting, currents can then flow, for example, only from the battery terminal to the battery cell or the other way, from the battery cell to the battery terminal. This enables a protection against overcharging for the battery cells as well as a protective circuit for deep-cycle battery cells. An inverse-polarity protection can also be realised.

During operation, the circuit arrangement thus provides various usage possibilities, depending on the placement of the semiconductor device as well as its driving. A multitude of applications is offered when the carrier plate supports a first electric potential of the three-pole during operation. Furthermore, the circuit boards can support two different potentials of the three-pole other than the first potential.

To form an electrical three-pole, it is proposed that the printed circuit boards be electrically insulated from each other. This can also be realised by means of an air gap. When used as a battery safety terminal as well as a starting current limit, the circuit boards can be electrically short-circuited with each other preferably on the output side, for example, by means of the contact lugs. Then the circuit boards support an identical potential and differ only in electric potential from the carrier plate.

The semiconductor devices can be arranged as switches or diodes between the carrier plate and at least one of the circuit boards.

Preferably, one of the semiconductor devices is a transistor, for example, an FET, an MOSFET, an IGBT, or something similar. In particular, leadless MOSFETs have been proven to be beneficial. The semiconductor devices are preferably power semiconductors with very high amperage of 50 ampere and higher.

According to an embodiment, it is proposed that at least one of the circuit boards bears terminals of the semiconductor device that are electrically separated from each other and that the carrier plate bears exactly one terminal of the semiconductor device. Particularly in the case that the semiconductor device is a transistor, it has at least three terminals, namely, the base (e.g. as a switch terminal), the emitter and collector (both e.g. as power terminals) or gate (switch terminal), drain and source (power terminals). Furthermore, MOSFETs can provide a substrate terminal which can preferably be short-circuited with the drain.

On the circuit board, two electrical potentials can be realised, namely, one first on the carrying material or substrate of the circuit board and one second which is electrically insulated from the first and provided on the conductive tracks of the printed circuit board. By means of these two potentials, the power terminal on the one hand and the switch terminal on the other hand may be connected. The switch terminal is preferably connected with conductive tracks of the circuit board and the power terminal can be in direct electrical contact with the substrate of the circuit board or the carrier plate.

The carrier plate and the circuit boards preferably have a solid metal material as a substrate which guarantees their mechanical stability. This material can have the electrical potential of a semiconductor terminal, preferably of the power terminal of the semiconductor device, and be short-circuited with it. In this case, the carrier plate has one electrical potential during operation. This electrical potential is the electrical potential of a power terminal of the semiconductor. Through the electrical short-circuit of the substrate of the carrier plate with the power terminal of the semiconductor device, it is possible to guarantee a good heat dissipation from the semiconductor device, particularly from the power semiconductor. The carrier plate does not only serve as an electrical connection, but at the same time also as a cooling element for the power semiconductor.

As mentioned, the power terminal can be short-circuited with the substrate (carrier material) of the circuit board. A switch terminal of the semiconductor device can then be short-circuited with conductive tracks which are arranged on the circuit board. Two electric potentials can therefore be provided on the circuit board, whereby one electric potential is that of the three-pole and carried in the substrate of the circuit board. The electric potential for driving the semiconductor device is preferably not one of the three-pole.

In addition, it is proposed that the mechanical connection between the carrier plate and the circuit board is realised by means of the semiconductor device. In particular, the positional relationship between the carrier plate and circuit board is preferably defined by means of the semiconductor device.

Preferably, the carrier plate is sandwiched between the circuit boards. This means that the carrier plate is bordered by the circuit boards on two opposing sides.

Along a surface area, preferably along the flat side, the carrier plate and circuit board are at least primarily parallel to each other. Preferably, the surface areas lie parallel to each other in such a way that an SMD assembly is possible for the carrier plate or the circuit boards or respectively their connection areas and contact areas with the semiconductor device. Tolerances of less than 1 mm are preferred.

Preferably, flat sides, i.e. the wide surface areas of the carrier plate and circuit boards, are arranged primarily parallel to each other.

The carrier plate and/or the circuit boards or their substrate are inherently stable. Preferably, they are resistant to bending. The cooling effect is particularly beneficial when the carrier plate and circuit board or the substrate are particularly formed from monolithic solid material.

The carrier plate and/or the circuit boards can be coated at least partially with an insulation layer. In particular, a solder resist is provided.

After the circuit arrangement has been assembled with the appropriate semiconductor devices and, if necessary, other passive components have been arranged between the carrier plate and circuit board, the circuit arrangement can be arranged in a casing. By means of the conductive tracks of the circuit boards, an external driving of the semiconductor device is enabled. For this purpose, plug connections, for example, are provided by which an external control circuit can be connected. The circuit arrangement can be encapsulated in a casing, whereby the carrier plate as well as the circuit boards are encapsulated in the casing. Contact lugs of the carrier plate and/or the circuit boards can be guided out of the casing. These contact lugs enable the connection of external potentials to the circuit arrangement.

The carrier plate and the circuit boards or their substrate are preferably made from aluminium, copper or alloys thereof. Copper has the advantage of very good conductivity and high thermal conductivity. Aluminium is considerably lighter than copper, thus being in favour for weight reduction requirements.

Preferably, the carrier plate and circuit board are primarily formed from a shared metal substrate. This can be a flat material, for example a band or sheet. The one-piece substrate can primarily be machined by means of metal-cutting, so that carrier plate and circuit boards are connected to each other only by a thin bridge of the substrate. The rest of the substrate between the carrier plate and circuit boards can be removed. Subsequently, the carrier plate and printed circuit boards can be coated with an insulation layer, for example, a solder resist. Thereby contact areas, contact pads and connection areas can be used kept open so that the substrate may be contacted through of the insulation layer. Subsequently or also before the application of the insulation layer, the pre-assembled substrate can be laminated with metal, for example nickel plated, as a semi-finished product. After a subsequent assembly with semiconductor devices, the bridge can be removed, e.g. by means of machining, and the carrier plate and printed circuit boards are connected with each other by means of semiconductor devices exclusively mechanically.

To contact the semiconductor devices which are arranged between the carrier plate and the circuit boards, the carrier plate and/or the circuit boards each have metal contact lugs on their front ends. The contact lugs can be arranged in such a way that the contact lug of the carrier plate is placed on the carrier plate on an end opposed to the contact lugs of the circuit board. This means that the contact lugs of the circuit boards can be arranged on the front end of the circuit arrangement and the contact lug of the carrier plate on the opposite front end.

To guarantee a good contact, it is proposed that the contact lugs be free from insulation material and preferably also be tin-plated. The contact lugs are formed from the same substrate as the carrier plate or the circuit boards. In particular, the contact lugs are formed as one piece from the carrier plate or the respective circuit boards.

In the field of power electronics, there are considerable temperature fluctuations in the power semiconductors. These temperatures are dissipated according to the subject-matter by means of the carrier plate or the circuit board. To symmetrise the temperature on the carrier plate and the circuit boards, it is proposed that they be supported on an additional, preferably metal, substrate. Between the carrier plate and the substrate, particularly on the opposite side of the semiconductor devices, an insulation layer is provided. The insulation layer prevents an electrical short-circuit of the carrier plate with the circuit boards and is preferably realised as a thermally-conductive layer. This ensures that the temperature between the circuit boards and the carrier plate are symmetrised and enables an uniform heat dissipation.

The use of a circuit arrangement is also proposed according to the subject-matter. The circuit arrangement may be used in many different layouts in vehicles according to the subject-matter and particularly within the scope of a battery safety terminal, as a starting current limiter, as an on-board power supply stabiliser, as a Q-diode or as a protection against battery overcharging.

On the carrier plate, an insulation layer, particularly an insulation coating, is applied which electrically insulates the carrier plate. However, in a connection area, the carrier plate is free from the insulation layer.

To electrically and also thermally connect a semiconductor to the circuit board, particularly a power semiconductor or high-power semiconductor, directly with the carrier plate, it is proposed that the carrier plate be coated with metal in a connection area. The metal coating can be formed before the application of the insulation layer or after the application of the insulation layer.

The metal coating is directly applied to the carrier plate and subsequently serves as a contact for the semiconductor. A semiconductor terminal is electrically contacted on the metal coating of the connection area. The carrier plate thus serves as a thermal and electrical element. As a result of the metal coating serving directly for the semiconductor contact with the carrier plate, a very good thermal contact between the semiconductor and the carrier plate is provided. The carrier plate serves directly as a supply line for a semiconductor terminal and can be electrically contacted by an area outside of the insulation layer, e.g. on the contact lug.

The insulation layer is preferably a solder resist which, for example, is applied in such a way that the connection area is free from the insulation layer. Subsequently, the connection area can be coated with metal by means of a tin plating.

Preferably, the insulation layer is imprinted on the carrier plate before the metal coating takes place.

According to an embodiment, the metal coating is a layer of tin. The layer of tin is preferably widespread, for example, applied on each of the connection surfaces between 5 $cm^2$ and 0.5 $mm^2$ on the carrier plate.

To mechanically support the semiconductor and keep the electrical contact as free as possible from mechanical tress, it is proposed that the metal coating be substantially plane parallel to the surface of the insulation layer. In this case, non-conducting areas which surround the semiconductor contact can rest directly on the insulation layer. The semiconductor normally has a widespread drain or source terminal. Preferably, the connection area or its metal-coated surface should be substantially congruent to the surface of the semiconductor terminal.

During the assembly, the semiconductor can be placed directly onto the connection area. Non-conductive areas, particularly on the border area of the semiconductor, can rest on the insulation layer, thus making the fastening of the semiconductor especially simple. In addition, a large contact area between the semiconductor terminal and the metal coating results so that besides a good electrical contact, an excellent thermal conduction from the semiconductor terminal to the carrier plate is possible.

As already mentioned, the semiconductor or the semiconductor terminal is electrically contacted with the carrier plate through the metal coating. The carrier plate can have a contact lug for a contacting with an electrical switch on one of its free ends. For example, it is possible for there to be a bore to accommodate a connection lug. Also, a cable lug or a crimp connection on the end of the carrier plate can be provided, and in this way the circuit board can be electrically contacted in a relatively easy way.

In particular, it is thereby to be ensured that a high amperage is provided. A contacting with an electrical circuit therefore takes place preferably with a cable that has a wire cross-section of at least 2.5 $mm^2$ so that the contacting on the end of the carrier plate must feature a contact surface of that size. Also to the conductive cross-section of the carrier plate should equal or be larger than the wire cross-section of the connected cable.

Preferably, along a common outer edge, particularly a longitudinal edge of the carrier plate, two or more connection areas are arranged next to each other and are separated by the insulation layer. In particular, more than two connection areas assigned to each other can be arranged on an outer edge of the carrier plate. The connection areas can also be arranged on two distal longitudinal edges of the carrier plate.

The circuit board also has a metal substrate. The substrate can be the same as the metal carrier plate. In particular, the same materials, the same conductive cross-section and/or the same form factors can be used. This makes the mass production of the circuit boards inexpensive.

The substrate of the circuit board is also coated on at least one surface to be electrically insulated. The insulation that is thereby used can substantially be applied on the full surface of the substrate. In particular, an insulation can be used which conventionally is used as a carrier for circuit boards. This can be a plastic sheet. In particular, pre-impregnated fibres, or a so-called pre-preg layer, can be used as an insulator. Subsequently, a conductive layer is placed on the insulator. The insulator and the conductive layer can be pressed with the substrate (of the carrier plate) on the full surface. The conductive layer can be a layer of copper, for example.

In a known fashion, conductive tracks can be etched from the conductive lay as is customary applied the production of conventional printed circuit boards.

Furthermore, an insulation layer, particularly an insulation coating, can be placed on the insulator and the conductive layer. This can also be an insulation lacquer, particularly a solder resist. This can take place before or after the conductive tracks are formed.

By means of milling or drilling, the insulator as well as the conductive layer can be penetrated, if they have not yet been etched away, to form a contact area to the substrate. Window-like through holes in the insulator can hereby form the contact area. In the contact area, the substrate can initially be exposed to form at least one contact pad.

To now enable a contacting of the semiconductor, it is proposed that in the contact area at least one metal contact pad be arranged on the substrate. The contact pad is thereby spaced circumferentially from the insulator and the conductive layer. The contact pad can hereby protrude at least from the plane of the insulator. If an additional insulation layer is formed on the insulator, e.g. an insulation lacquer, the contact pad can substantially end in the plane of the insulation layer.

To avoid an electrical contact forming between the contact pad and the conductive layer, the contact pad is fully circumferentially spaced from the conductive layer. Therefore, unlike conventional μvias, the contact pad is not suited to connect the conductive track of the conductive layer with the substrate to enable a cooling of the conductive track of the conductive layer. Instead, the substrate is directly contacted with the contact pad as an electrically conductive element and an electrical contact, particularly a power terminal of a semiconductor, can be placed on the contact pad. In addition, the contact surface is formed in contrast to the μvias as window-like holes in the insulator to simplify their production. The contact surface is normally 2 to 10, preferably 4 to 7 times as large as the surface of the individual contact pads.

In particular, if the semiconductor is an SMD element and the power terminals and switch terminals along a common edge of the semiconductor should be contacted by means of contact pins which lie on a plane, it is beneficial if the contact pads are substantially plane parallel to the screen. In this case, the semiconductor can be applied on the contact pad and simultaneously on the conductive layer. A twisting or tilting relative to the conductive layer or the contact pad is thereby impeded. On the conductive layer or the conductive track of the conductive layer, a switch contact pin can be contacted and the contact pad can be contacted with the power contact pin.

In particular, multiple contact pads can be arranged next to each other which each have a surface corresponding to a semiconductor contact pin. On the semiconductor, multiple power contact pins and a switch contact pin are arranged along a common edge. The corresponding power contact is provided on a distal edge. The multiple jumper contact pins which are arranged on the side of the switch contact pin can be applied on the contact pad or the contact pads which are arranged next to each other and the switch contact pin can be applied on the conductive layer. A relatively simple contacting through SMD soldering can then take place.

To create the contact pad on the substrate, the contact area can be coated with a photoresist and then the area of the contact pads which are spaced apart from the insulator can be exposed to light. After the removal of the coated area of the photoresist, the carrier plate is exposed here. The contact pad can then preferably be chemically grown here. The unexposed areas of the photoresist or the substrate are thereby not exposed to copper. The formed contact pad is thereby spaced apart from the insulator as well as conductive layer.

The contact pad has a metal surface that can be soldered. As mentioned, this can be chemically grown, for example, by being formed from nickel or tin. In addition, it can be plated with nickel or gold. A chemical growing from tin or silver in the unexposed area is also possible. The growing of the contact pad can be performed until its surface is plane parallel either to the insulation layer or the conductive layer. The planes of the contact pad and the conductive layer or the insulation layer can hereby be understood to be plane parallel with a deviation of less than 10 μm.

To enable an electrical insulation of the contact pad from the conductive layer and/or the insulation layer, a space or annulus between the contact pad and the conductive layer and/or insulator is proposed. The space between the contact pad and conductive layer and/or insulator can thereby range between 10 mm and 0.5 mm.

The space between the contact pad and the conductive layer and/or the insulator can be free from filling material. In particular, an air gap can exist. It is also possible for the insulation layer to be inserted into the space.

As already mentioned, a power contact can be connected with a contact pad. To contact the corresponding switch terminal with the conductive layer, the switch terminal preferably being arranged along the same edge of the semiconductor, the conductive layer or the conductive track of the screen can feature a connection pad. The connection pad has a surface that can be soldered and serves to connect the switch terminal.

The connection pad as well as the contact pad or the contact pads located next to each other can be arranged along a common outer edge of the circuit board.

To contact a semiconductor to the circuit board, connection pads as well as contact pads are provided. The contact pad can contact several similar electric pins, i.e. several or all pins of a power terminal of a semiconductor, in which several contact pins are provided next to each other. The contact pads can be contacted with one or several pins of a power terminal of a semiconductor. In addition, the connection pad can be electrically contacted with a pin of a switch terminal of the semiconductor. The soldering areas of the contact pad as well as the connection pad are congruent to the distances of the semiconductor contact pins from each other.

An excellent electrical as well as thermal connection between the carrier plate circuit board and the semiconductor is enabled by means of the contact pads being coated with metal. In this respect, it is suggested that the power terminal be electrically contacted with the substrate by means of the contact pad.

Conductive tracks can be provided on the conductive layer; in particular, they are etched out of the conductive layer and at least parts of a control switch are included for the gate terminal. At least part of a control circuit for the semiconductor can thus be directly provided on the circuit board.

According to an embodiment, it is proposed that at least one connection pad and at least one contact pad be arranged in the area of an outer edge of the circuit board. In particular, the connection pad and contact pad can be arranged next to each other along a longitudinal edge of the circuit board. The connection pad can be directly arranged next to the contact pad on an outer edge of the circuit board.

To prevent tilting of a soldered semiconductor, it is proposed that the connection pad and the contact pad be substantially arranged plane parallel to each other. The soldered areas of the connection pad and contact pad are shaped in such a way that they lie primarily in the same plane.

According to an embodiment, it is proposed that the substrate has a thickness of at least 1 mm, preferably at least 1.5 mm but less than 50 mm. It is also proposed that the cross-section of the carrier plate be over 2.5 mm².

The outer edges of the circuit boards bearing the connection area can run parallel to the outer edges of the carrier plate which include the contact area. This facilitates the mechanical connection of the circuit boards with the carrier plate by means of the semiconductor.

In the following, the subject-matter is explained in more detail by means of a drawing showing embodiments. In the drawing show:

FIG. 5b a sectional view of a circuit board according to FIG. 5a;

FIG. 6 a sectional view of a circuit board according to FIG. 5a;

FIG. 10b a sectional view according to FIG. 10a;

Figure 1:
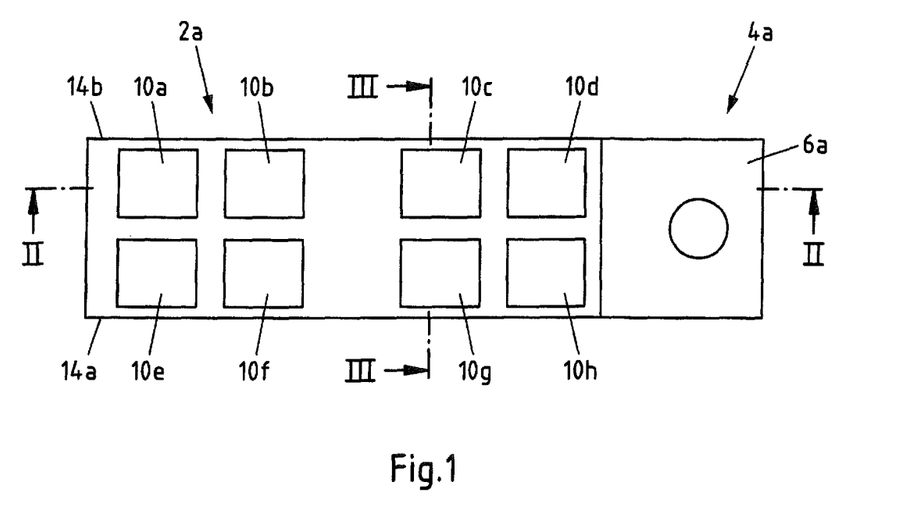
FIG. 1 a top view of a carrier plate.

FIG. 1 shows a carrier board (plate) 2a. This carrier plate 2a can be a high-current carrier plate with an ampacity of over 10 ampere, preferably of over 300 ampere. For this purpose, this carrier plate 2a has a metal substrate. The substrate has a line cross-section of over 5 mm², preferably over 15 mm², particularly over 35 mm².

In the top view of the carrier plate 2a, it is seen that the carrier plate 2a features a connection lug 6a on the first free end 4a. In the example shown, the connection lug 6a has a drilled hole to accommodate a cable. At the free end 4a, the carrier plate 2a is coated with tin, particularly free from an insulation layer.

A dominant piece, particularly more than two-thirds of the surface of the carrier plate 2a, is insulated and features at least one insulation layer 8 on a flat side. The insulation layer 8 is preferably a solder resist which is printed onto the carrier plate 2a. This can take place by means of a screen printing process.

As can be seen, the insulation layer 8 does not exist in several connection areas 10a-h. Instead of the insulation layer 8, a metal coating 12 is applied in the connection areas 10*a-h*. The metal coating 12 is preferably a layer of tin or a layer of another material that is suitable for soldering.

It is also seen that the connection areas 10*a-h* are arranged on opposing lateral edges 14*a*, 14*b* of the carrier plate 2*a*. They are usually the longitudinal edges of the carrier plate 2*a*.

During the imprinting of the carrier plate 2*a* with the insulation layer 8, the connection areas 10*a-h* are omitted and subsequently the metal coating 12 is applied. The metal coating 12 can form a contact for the semiconductor. The composition of the printed circuit board 2*a* is explained in cross-section II-II according to FIG. 2.

Figure 2:
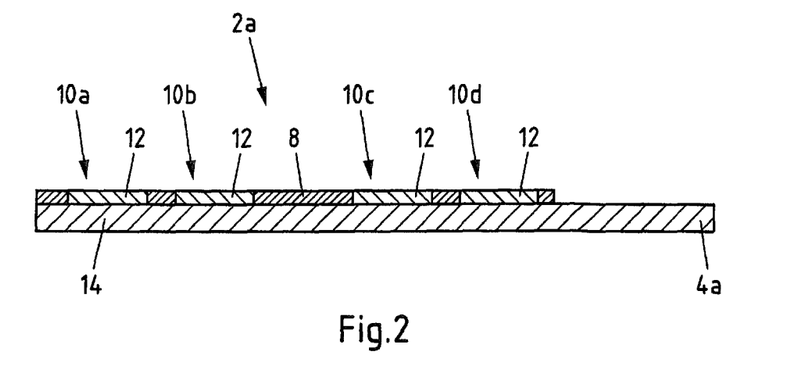
FIG. 2 a sectional view of the carrier plate according to FIG. 1.

In FIG. 2, it can be seen that the carrier plate 2*a* features a metal substrate 14. The substrate 14 can be made from copper or alloys thereof. It is also possible for the core of the carrier plate 2*a* to feature aluminium or alloys thereof and to be coated with copper, alloys or tin, respectively.

Furthermore, it can be seen that the insulation layer 8 is applied onto the substrate 14. The substrate 14 is free from the insulation layer 8 in the connection areas 10*a-h* and the metal coating is applied. The metal coating 12 is directly applied onto the substrate 14. In FIG. 2, it can be seen that the metal coating 12 runs substantially along a surface plane parallel to the surface of the insulation layer 8.

Furthermore, it can be seen that the connection areas 10*a-h* are assigned to each other respectively in groups of four connection areas 10*a, b e, f* and 10*c, d, g, h*, as an example.

Figure 3:
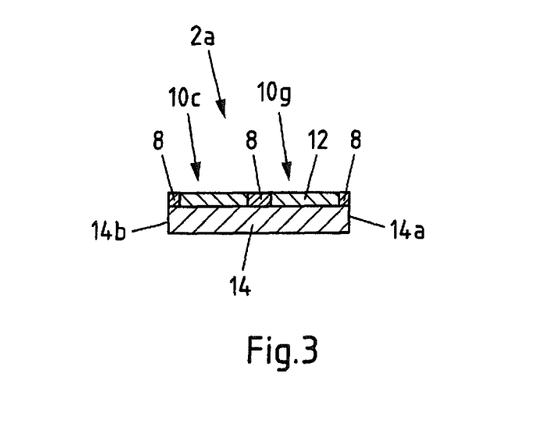
FIG. 3 another sectional view of the carrier plate according to FIG. 1.

FIG. 3 shows cross-section III-III according to FIG. 1. The substrate 14 and the insulation layer 8 can again be seen. It can furthermore be seen that the connection area 10*g* is provided on the lateral or outer edge 14*a* of the carrier plate 2*a* and the connection area 10*g* is provided on the lateral or outer edge 14*b* of the carrier plate 2*a*. It can be seen that the connection areas 10*a, g* do not immediately end with the lateral edges 14*a, b*, but that a relatively narrow area of the insulation layer 8 remains between the coating 12 and the lateral edges. This area is preferably smaller than 1 mm, preferably smaller than 0.5 mm, particularly smaller than 0.1 mm. However, it is also possible that the metal coating 12 reaches to the lateral edges 14*a, b*.

The carrier plate 2*a* is suitable for connection to a drain or source terminal of a transistor, particularly a high-power SMD transistor. As such it has a large-scale source or drain terminal on its underside which can be soldered with the metal coating 12. As a result of the metal coating 12 being preferably substantially congruent to the surface of the source or drain terminal, it can be placed on the connection area 10 with a large contact surface area and in addition to a good electrical contact taking place, a good thermal conduction of thermal energy also takes place from the semiconductor by means of its drain or source terminals into the substrate.

Figure 4:
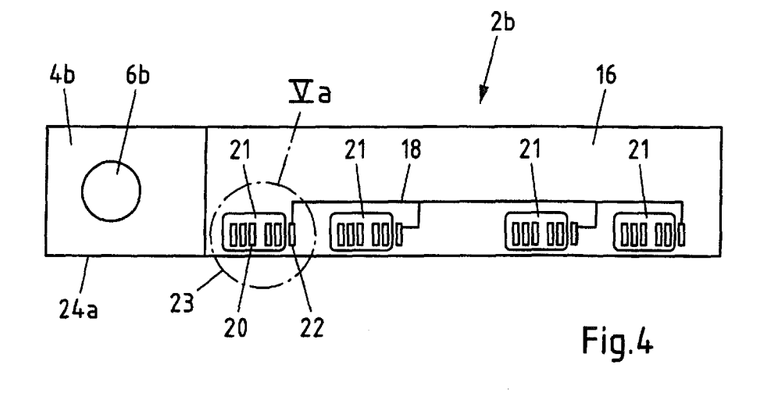
FIG. 4 a top view of a circuit board with contact pads and connection pads.

FIG. 4 shows a circuit board 2*b* which also features a free end 4*b* and a connection lug 6*b*. The free end 4*b* and the connection lug 6*b* is designed proportionately to the free end 4*a* and the connection lug 6*a*. Furthermore, it can be seen that the insulator 16, e.g., a plastic, a pre-preg or similar material, is applied onto the circuit board 2*b*. This insulator 16 together with the conductive layer can be pressed onto a metal substrate 24. Subsequently, a conductive track 18 can be created by being exposed to light and etched from the conductive layer. The conductive track 18 runs according to a circuit topology on the insulator 16 and serves to connect the power electronics (not depicted).

Facing towards an outer edge 24*a* contact pads 20 and connection pads 22 can be provided. In particular, the connection pad 22 can be directly contacted with the conductive track 18. The contact pads 20 are arranged in a window-like through-hole 21 of the insulator 16. In this through-hole 21, the substrate 24 is initially left uncovered. An insulation layer 8 can later be applied, after the contact pads 20 are formed. In the through-hole 21, the contact pads 20 are spaced apart from the insulator 16 as well as the conductive tracks 18 or the conductive layer by means of an insulation gap, particularly an air gap. As is seen, a plurality of contact pads 20 are provided in a through-hole 21. Directly next to a through-hole 21 on the insulator 16, a connection pad 22 assigned to the contact pads 20 can be provided. The number of contact pads 20 as well as the connection pad 22 can be chosen in proportion to the number of contact pins of a power semiconductor. In particular, a transistor has for thermal conduction a plurality of power contact pins and precisely one switch contact pin. The switch contact pin can be connected with the connection pad 22 and the power contact pins can be connected with the contact pads 20.

In order to prevent the contact pads 20 being electrically short-circuited with the connection pad 22, the electrically conductive area of the contact pads 20 must be insulated from the conductive track 18. For this purpose, after the insulation layer 16 as well as the conductive layer has been pressed onto the substrate 24, each opening 21 assigned to a connection pad 22 is milled or drilled through the substrate 24. A photoresist can then be exposed to light in the opening 21. The area exposed to light can correspond to the surface of the contact pads 20. This area of the photo resist is removed and then the contact pads are directly grown on the carrier plate 24, e.g. chemically. This structure is depicted in detail 23 in FIGS. 5*a* and 5*b*.

Figure 5A:
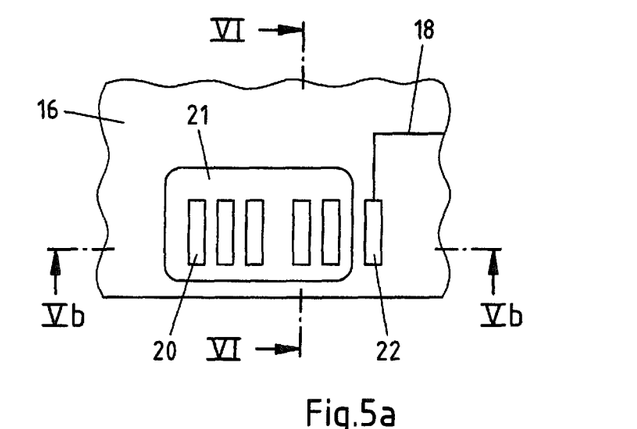
FIG. 5a a detailed view of a circuit board according to FIG. 4.
Figure 5B:
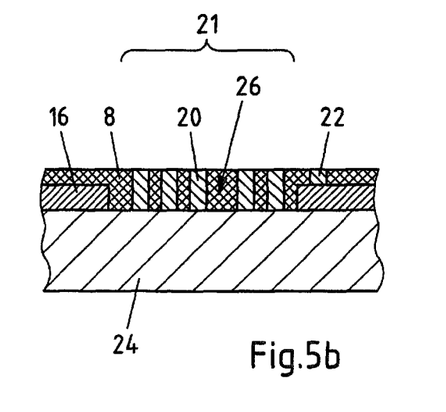

FIG. 5*b* depicts the detail 23 in cross section Vb-Vb. FIG. 5*b* shows a metal substrate 24 which can be formed in proportion to the metal substrate 14. The insulator 1 and a conductive layer that is not depicted can be pressed onto the substrate 24. Subsequently, the conductive layer can be exposed to light and etched so that conductive tracks 18 are formed on the insulator 16.

The insulator 16 in the opening 21 is removed, e.g. by drilling or milling. The conductive layer in the opening 21 can also be removed, e.g. by drilling or milling or in particular by etching. Subsequently, inside of the opening 21, at least one contact pad 20 can be applied onto the substrate 24 by means of a thermal and/or galvanic process. As is seen, the opening 21 is formed in such a way that the contact pad 20 is spaced apart from the insulator 16. Furthermore, there is no contact to the conductive layer and also no contact to the conductive tracks 18. After the contact pad 20 has been formed, an insulation layer 8 can be applied in the area of the opening 21, particularly as it is applied on the rest of the circuit board 2*b*, except for the end 4*b*.

The connection pad 22, which can be produced by exposing a conductive layer to light and etching it, is in contact with the conductive tracks 18. The contact pads 20 and connection pads 22 are coated in a solderable way and/or formed from a solderable material. As can be seen, the contact pads 20 are primarily parallel to the insulation layer 16 on their outer-facing surface and preferably plane parallel to the conductive tracks 18 and the connection pad 22.

FIG. 5*a* shows the top view of the detail 23. It can be seen that several contact pads 22 are provided in an opening 21 at a distance from the insulator 16. The insulator 16 is removed in the opening 21 and the metal of the substrate 24 can be directly coated. It can also be seen that the connection pad 22 is arranged on the side of the opening 21.

Figure 6:
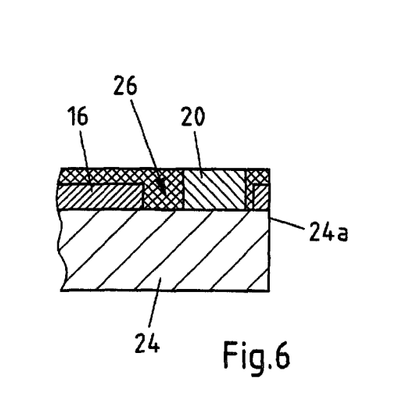

In FIG. 6, cross section VI-VI of FIG. 5a is depicted. Corresponding to the metal coatings 12, the contact pads 20 are also assigned to an outer or longitudinal edge 24a, but preferably spaced from them by means of web of insulation 16. According to FIG. 3, this web is very narrow, preferably less than 1 mm. The web can also be omitted and the contact pads 20 can be directly arranged on the longitudinal edge 24a.

Figure 7:
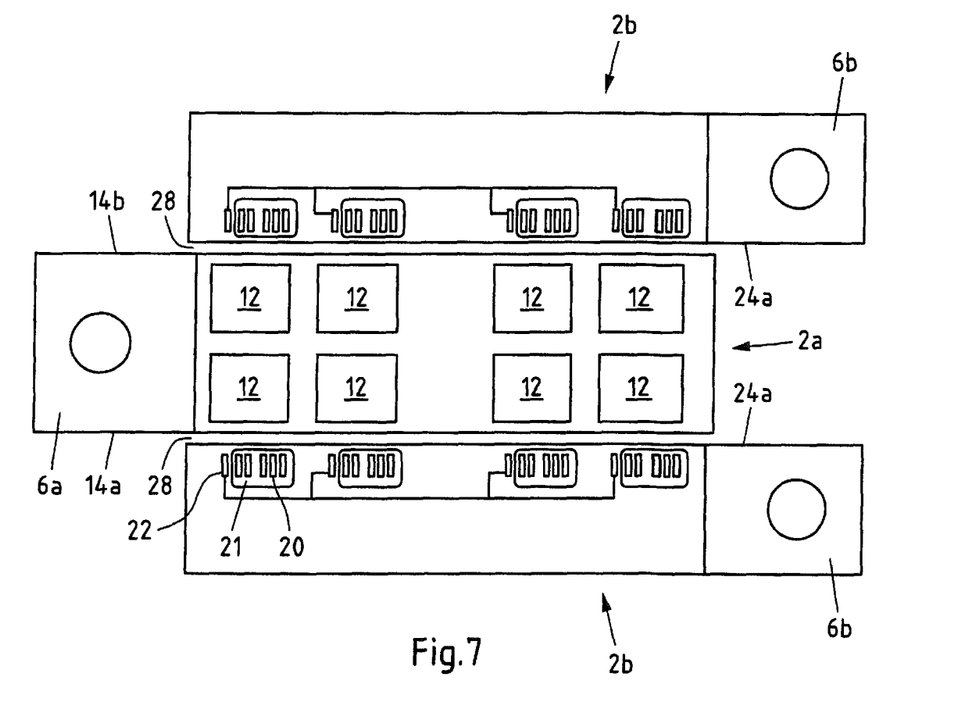
FIG. 7 a top view of a circuit arrangement prepared for assembly.

The carrier plate 2a and circuit board 2b produced according to FIG. 1 and FIG. 4 are arranged so that they are spaced apart from each other by means of an air gap 28. The carrier plate 2a, as depicted in FIG. 7, is thereby sandwiched between two circuit boards 2b and spaced apart from them by means of an air gap 28. The longitudinal edge 14a is facing the longitudinal edge 24a of a first circuit board 2b and the longitudinal edge 14b is facing the longitudinal edge 24a of a second circuit board 2b. Furthermore, the metal coatings 12 as well as the contact pads 20 and connection pads 22 are provided along the longitudinal edges 14a, 24a, or 14b, 24a at the same distance from the contact lugs 6a, 6b. This means that if the carrier plate 2a is arranged between the circuit boards 2b, the metal coatings are each facing the contact pads 20 and connection pads 22.

Figure 8:
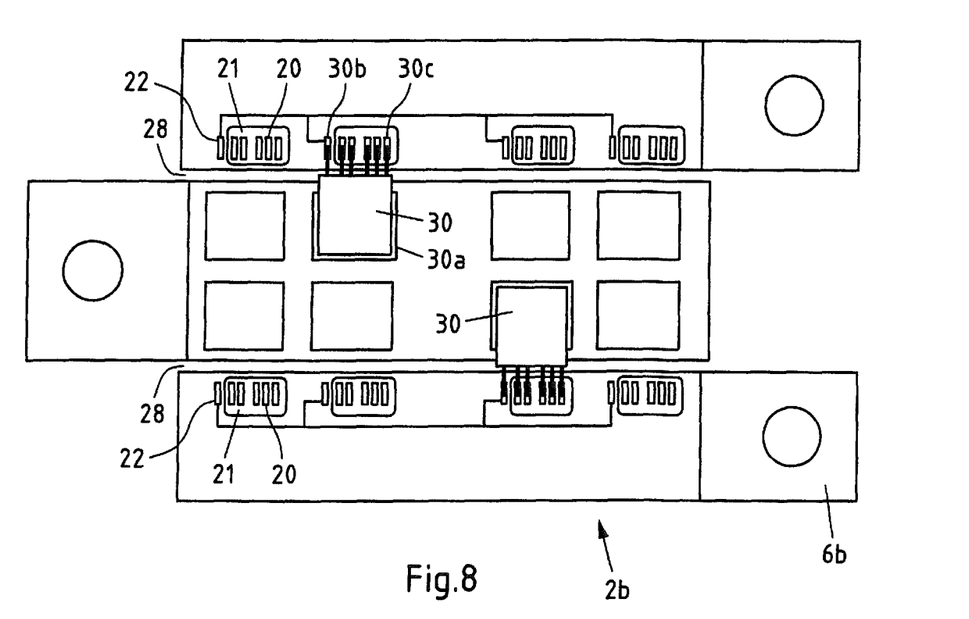
FIG. 8 a top view of an assembled circuit arrangement.

The carrier plate 2a and circuit boards 2b arranged according to FIG. 7 are then fed to an assembly device and assembled with transistors 30. As can be seen in FIG. 8, the air gap 28 between the carrier plate 2a and the circuit boards 2b are mechanically and electrically bridged by the transistor 30.

The transistor 30 has a drain terminal 30a on one of its sides. This is preferably arranged on the underside of the transistor 30 with a large contact surface area. The drain terminal 30a is soldered onto the metal coating 12 by means of soldering technology. On the opposite side, the transistor is equipped with a gate contact pin 30b and five source contact pins 30c. The gate contact pin 30b is connected with the connection pad 22 by means of soldering. The source contact pins 30c are connected with the contact pads 20 by means of soldering. By soldering the transistor 30 onto the metal coating 12 respectively the contact pads 20 and connection pads 22, a mechanical fixation of the carrier plate 2a to the circuit boards 2b takes place.

It is understood that the conductive tracks 18 can be used to contact a control circuitry with the gate contact pin 30b. It is also possible for a double-sided assembly to be made, and consequently the semiconductors would be arranged on the upper side and the underside of the circuit boards.

Figure 9:
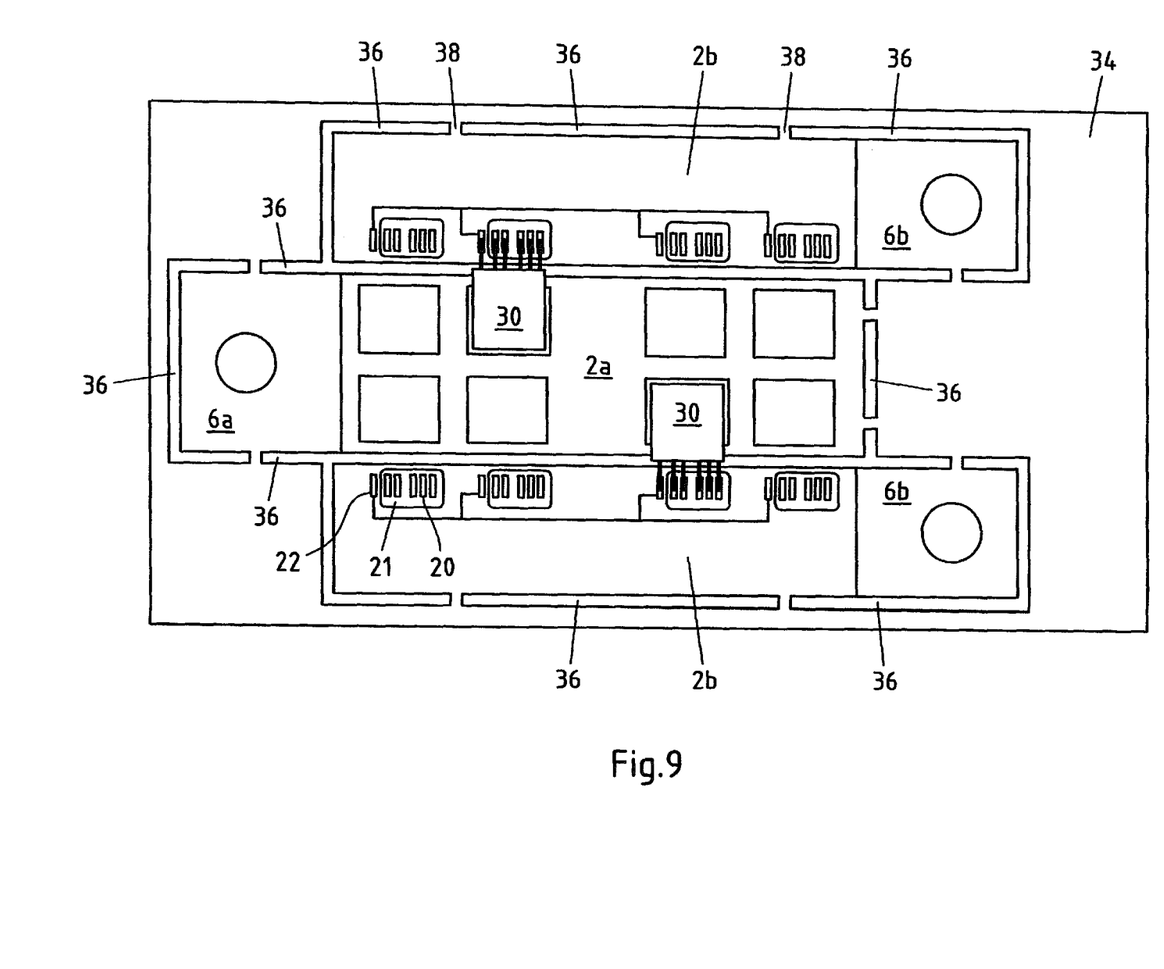
FIG. 9 a top view of a monolithic carrier plate with circuit boards and a carrier plate before the webs are removed.

FIG. 9 shows a metal substrate 34. The substrate 14 and the substrate 24 can be formed in this. This can be done, for example, by milling of corresponding gaps 36 into the substrate 34. It is seen that the substrate 34 is monolithic and the substrates 14 and 34 are mechanically connected with webs 38 between them and the substrate 34.

The substrate 34 is processed in such a way that the aforementioned metal coatings 12 on the substrate 14 and contact pads 20 and connection pads 22 are formed on the substrate 24. Subsequently or before that, the gaps 36 can be provided with the webs 38 in the substrate 34.

It can be seen that the carrier plate 2b is arranged between the circuit boards 2b and respectively spaced apart by means of the gap 36. The contact lug 6b is arranged on the end of the carrier plate 2a facing away from the contact lugs 6b. The metal coatings 12 are situated opposite of the connection pad 22 and the contact pads 20 of the respective circuit boards 2b.

It is evident that the concept of a metal coating 12 means that a contact or connection, particularly a soldered connection, is formed on the substrate 14.

An assembly, as shown in FIG. 9, can take place by means of SMD assembly, for example. At least one transistor 30 can be soldered with the metal coating 12 on one hand and with the contact pads 20 and the connection pads 22 on the other hand. After the solder has hardened, the transistors 30 mechanically and electrically connect the printed circuit boards 2b with the carrier plate 2a. The bridges can be removed 38. The single mechanical and electrical connection between the carrier plates 14 and 24 is formed by the transistors 30.

Figure 10A:
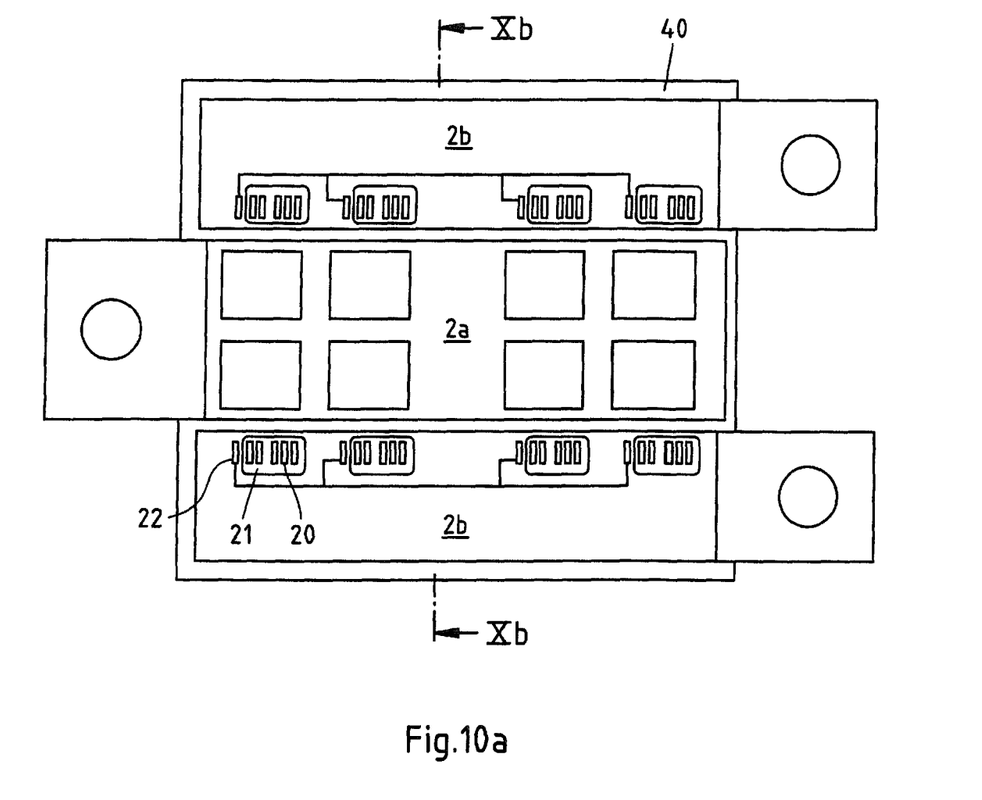
FIG. 10a a top view of a circuit arrangement prepared for assembly with additional thermal balancing.
Figure 10B:
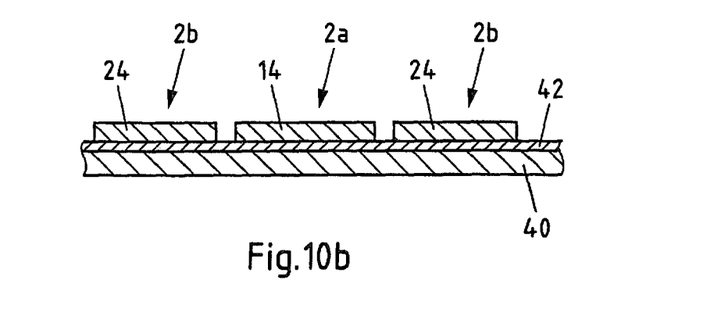

FIG. 10a shows a circuit arrangement according to FIG. 9 without assembly. In addition to the substrates 14 and 24 of the carrier plate 2a and the circuit boards 2, a substrate 40 is provided which is also preferably made from metal and should achieve thermal balancing. For this purpose, the substrate 40, as shown in FIG. 10b, is arranged underneath the circuit boards 2b and the carrier plate 2a. It can be seen that a heat conductor, e.g. an insulator 42 made from thermal paste, is formed between the substrates 14, 24 and the substrate 40. Thermal energy is transferred from the substrates 14, 24 to the substrate 40 if the semiconductor 30 has heat loss during operation and the substrates 14, 24 heat up. An improved cooling of the semiconductor 30 is thereby enabled and the temperature is symmetrised as far as possible by the substrate 40.

Figure 11A:
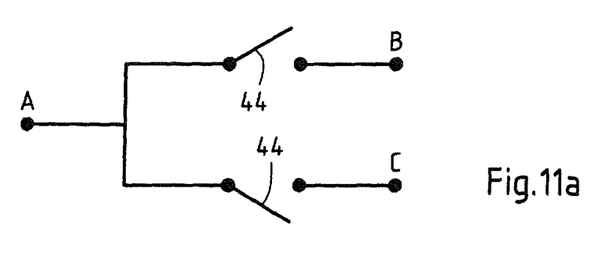
FIGS. 11a-c equivalent circuit diagrams of potential circuitry for the three-pole.
Figure 11B:
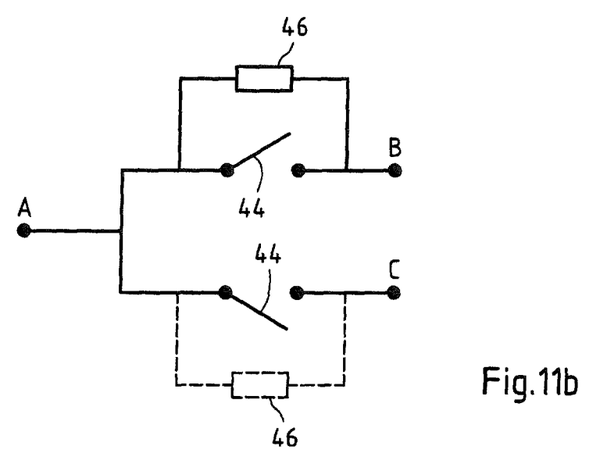
Figure 11C:
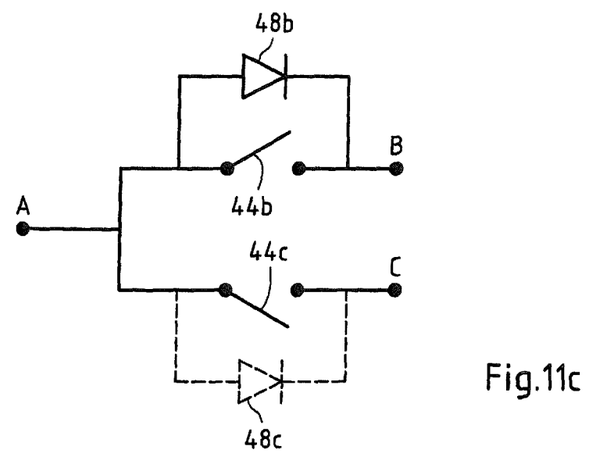

FIGS. 11a-c exhibit possible equivalent circuit diagrams of the circuit arrangement according to the subject-matter. It can be seen that the circuit arrangement is formed as a three-pole with poles A, B and C. A tapping of pole A can be on the contact lug 6a of the carrier plate. A tapping of pole B can be on the contact lug 6b of a first circuit board 2b. A tapping of pole C can be on the contact lug 6b of a second circuit board 2b.

A switch 44 is formed between poles A, B and C, respectively, according to FIG. 11a. This can be realised by means of a transistor 30 respectively. One current path between terminal A and terminal B or terminal C is secured respectively by the switch 44. To be used in a battery safety terminal (SBK), pole A, for example, can be tapped to the B+ pole of the battery. At least one of poles B or C can be connected with the starter cable. In the event of a crash, the switch 44 can be opened and the starter cable can thus be disconnected from the battery. If poles B and C are short-circuited, the ampacity of the SBK can be doubled.

FIG. 11b shows an application in a starting current limiter. Pole A is connected with the B+ pole of the battery. Pole B can be connected with the starter cable. A resistor 46 can be arranged parallel to the switch 44. It can also be arranged over the contact pads 20 and the coating 12 between the carrier plate 2a and the circuit board 2b. In the start-up moment, the switch 44 is opened and current can flow from the battery to the starter only by means of the resistor. The current is thus limited. After the first initial start-up, the switch 44 is closed and the battery is connected with the starter. To increase the starting current capacity, another resistor 46 can optionally be provided (shown with dotted lines) which is arranged between pole A and pole C. If both poles B and C are connected with the starter cable, the starting current is halved between each resistor.

FIG. 11c shows an application by which, for example, a switch 44 and a diode 48 are provided. The diode can also be arranged with the coating 12 and the contact pads 20 between the carrier plate 2a and the circuit board 2b. If pole A is connected with a starter battery and pole B with an on-board power supply battery, the switch can function as a Q diode. When starting, no power from the on-board power supply batter can flow to the starter as long as the switch 44 is open. As an option, another diode 48 (shown with dotted lines) can be provided to double the ampacity of the switch.

The circuitry according to FIG. 11c can also be used to protect the battery cells. Pole C can, for example, be connected to the positive pole of the battery cells. Pole B can be connected to the positive pole of the battery. Pole A is not contacted externally.

If the switch 44b is closed and the switch 44c is open, the battery cell can be charged. Then a charging current from pole B can flow to the battery cells by means of the diode 48c. A reversal of battery terminals is avoided. When discharging, the switch 44c can be closed and the switch 44b can be opened. Current can flow from the battery cells by means of the diode 48b. A reversal of battery terminals is avoided.

Other applications for the objective circuit arrangement according to the subject-matter are possible which are not depicted in detail for the sake of brevity. Depending on the assembly and control, different circuits may be realised with an identical layout.

The invention claimed is:

1. A vehicle circuit arrangement comprising:
   a first metal circuit board;
   a second metal circuit board;
   at least one first metal carrier plate electrically connected with at least the first circuit board by means of at least one first semiconductor device and electrically connected with at least the second circuit board by means of at least one second semiconductor device such that the carrier plate and the circuit boards form an electrical three-pole, wherein the at least one first metal carrier plate is spaced electrically insulated from the first and second circuit boards;
   wherein the carrier plate is short circuit with a respective one of a power terminal of the first and second semiconductor devices, wherein the respective power terminal is electrically connected with a metal coating arranged directly on the carrier plate; and
   wherein the first and second circuit board include conductive tracks, wherein a power terminal of a respective first and second semiconductor device is short circuited with a contact pad that is spaced from the conductive tracks, wherein the contact pad is arranged in a contact area, which is arranged as a window-like opening in an insulating layer of the circuit board, and a switching terminal of the respective first and second semiconductor is short circuited with a respective conductive track.

2. Vehicle circuit arrangement according to claim 1, wherein the electrical three-pole is set up as at least one of the circuits for one of
   A) electrical battery safety terminal,
   B) starting current limit,
   C) on-board power supply stabiliser,
   D) Q-diode,
   E) protection against battery overcharging.

3. Vehicle circuit arrangement according to claim 1, wherein during operation, the carrier plate carries a first potential of the three-pole and the circuit board carries two different potentials that are different from the first potential.

4. Vehicle circuit arrangement according to claim 1 wherein the circuit boards are electrically insulated from each other.

5. Vehicle circuit arrangement according to claim 1 wherein the at least one first semiconductor device forms a switch or a diode between the carrier plate and the first circuit board.

6. Vehicle circuit arrangement according to claim 1 wherein the at least one first semiconductor device is formed as a transistor.

7. Vehicle circuit arrangement according to claim 1 wherein at least one of the circuit boards bears two contacts of its respective semiconductor device that are electrically separated from each other and that the carrier plate bears a contact of the respective semiconductor device.

8. Vehicle circuit arrangement according to claim 1 wherein the carrier plate has a shared electrical potential with the semiconductor device that respectively connects a contact of the carrier plate with the circuit board.

9. Vehicle circuit arrangement according to claim 1 wherein during operation, the carrier plate carries exactly one electrical potential.

10. Vehicle circuit arrangement according to claim 1 wherein at least the first circuit board has a common electrical potential with a connection of the at least one first semiconductor device, and that an electrical potential is borne on the circuit board to control the semiconductor device.

11. Vehicle circuit arrangement according to claim 1 wherein the at least one first semiconductor device mechanically connects the carrier plate with the first circuit board.

12. Vehicle circuit arrangement according to claim 1, wherein the carrier plate is sandwiched between the first and second circuit boards, and/or the carrier plate and the first and second circuit boards are arranged substantially parallel to each other at least along a surface.

13. Vehicle circuit arrangement according to claim 1, wherein the carrier plate and/or the circuit boards are dimensionally stable and/or resistant to bending and/or formed from a solid material and/or a monolithic material.

14. Vehicle circuit arrangement according to claim 1, wherein the carrier plate and/or the circuit boards are coated with an insulation layer.

15. Vehicle circuit arrangement according to claim 1, wherein the carrier plate and the circuit boards are both encapsulated in a common casing and respectively a metal contact lug that is guided out of the casing.

16. Vehicle circuit arrangement according to claim 1, wherein the carrier plate and the circuit boards are formed from aluminium and/or copper or alloys thereof.

17. Vehicle circuit arrangement according to claim 1, wherein the carrier plate and the circuit boards respectively have a metal contact lug on front end.

18. Vehicle circuit arrangement according to claim 17, wherein the carrier plate and the circuit boards are at least partially tin-plated, particularly in the area of the contact lugs.

19. Vehicle circuit arrangement according to claim 17, wherein the contact lug of the carrier plate is arranged at an end facing away from the metal contact lugs of the circuit boards.

20. Vehicle circuit arrangement according to claim 1, wherein the carrier plate and the circuit boards are arranged on a common metal substrate, with an electrically separating layer arranged between the substrate and the carrier plate and the circuit boards.

21. Vehicle circuit arrangement according to claim 20, wherein the separating layer is a thermally-conductive layer.

* * * * *